(12) United States Patent
Chou et al.

(10) Patent No.: US 7,012,441 B2
(45) Date of Patent: Mar. 14, 2006

(54) HIGH CONDUCTING THIN-FILM NANOPROBE CARD AND ITS FABRICATION METHOD

(75) Inventors: Min-Chieh Chou, Taipei (TW); Ya-Ju Huang, Taipei (TW); Horng-Chieh Wang, Taipei (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 10/455,447

(22) Filed: Jun. 6, 2003

(65) Prior Publication Data

US 2004/0211589 A1    Oct. 28, 2004

(30) Foreign Application Priority Data

Apr. 24, 2003   (TW) ............................. 92109563 A

(51) Int. Cl.
G01R 31/02 (2006.01)
(52) U.S. Cl. ...................................... 324/754; 324/761
(58) Field of Classification Search ........ 324/754–765, 324/158.1; 257/48; 438/14–15
See application file for complete search history.

(56) References Cited

U.S. PATENT DOCUMENTS

| | | | |
|---|---|---|---|
| 4,715,117 A * | 12/1987 | Enomoto | 29/851 |
| 5,090,118 A | 2/1992 | Kwon et al. | |
| 6,232,706 B1 * | 5/2001 | Dai et al. | 313/309 |
| 6,340,822 B1 * | 1/2002 | Brown et al. | 257/25 |
| 6,831,017 B1 * | 12/2004 | Li et al. | 438/694 |
| 6,855,603 B1 * | 2/2005 | Choi et al. | 438/268 |
| 6,891,386 B1 * | 5/2005 | Matsuzawa | 324/760 |

OTHER PUBLICATIONS

"Electron Transport Through Metal-Multiwall Carbon Nanotube Interfaces" by Ngo et al. Jun. 2004, IEEE transactions on nanotechnology, vol. 3 No. 2.*

* cited by examiner

Primary Examiner—Paresh Patel
(74) Attorney, Agent, or Firm—Bacon & Thomas, PLLC

(57) ABSTRACT

A conducting thin-film nanoprobe card fabrication method includes the steps of: (a) arranging nanotubes on a substrate in vertical; (b) covering the nanotubes with a liquid polymeric resin and then hardening the polymeric resin to form a conducting nanomembrane; (c) removing a part of the polymeric resin from the conducting nanomembrane to expose one end of each nanotube to outside; (d) removing the substrate and preparing a ceramic substrate having contacts at one side and metal bumps at the other side and plated through holes electrically respectively connected with the contacts and the metal bumps; (e) mounting the nanomembrane on the ceramic substrate to hold the nanotubes in contact with the contacts of the ceramic substrate, and (f) forming recessed holes in the nanomembrane by etching and inserting a metal rod in each recessed hole to form a respective probe.

7 Claims, 8 Drawing Sheets

HIGH CONDUCTING THIN-FILM NANOPROBE CARD AND ITS FABRICATION METHOD

BACKGROUND OF THE INVENTION

1. Field of the Invention

The present invention relates generally to the fabrication of probe card for probing electronic devices and, more specifically, to a high conducting thin-film nanoprobe card fabrication method.

2. Description of the Related Art

Future electronic device probing technology will encounter technical challenges in ultra fine pitch, area array testing, high frequency and low cost. Currently, commercialized probing technology for use in high frequency probing includes two types, one is coaxial probe card and ceramic blade probe card, and the other is membrane probe card as disclosed in U.S. Pat. No. 5,090,118. The fabrication of a coaxial probe card or ceramic blade probe card is achieved by mounting coaxial probes or ceramic blade probes in a printed circuit board (PCB) individually. This fabrication cannot satisfy the demand for ultra fine pitch. Further, the maximum probing frequency of a coaxial probe card or ceramic blade probe card reaches 2~3 GHz only. A membrane probe card is obtained by means of forming metal bumps on a polymeric membrane. The advantage of a membrane probe card is its limited exposed metal area and maximum 20 GHz probing frequency. However, a membrane probe card still has numerous drawbacks as follows:

1. This kind of probe card does not satisfy technical requirement for 40 GHz probing frequency in RF device testing.

2. Due to the limitation of the spring power of polymeric membrane, this kind of probe card cannot compensate test samples for coplanar error; therefore this kind of probe card is not practical for use in multi-DUT (Die Under Test) testing.

3. The manufacturing cost of this kind of probe card is too high (about 2~3 times over conventional probe cards) to be popularly accepted.

SUMMARY OF THE INVENTION

The present invention has been accomplished under the circumstances in view. It is the main object of the present invention to provide a high conducting thin-film nanoprobe card fabrication method, which is practical for making nanoprobe cards of probing frequency as high as 40 GHz that is capable of compensating test samples for coplanar error for use in multi-DUT (Die Under Test) testing.

It is another object of the present invention to provide a nanoprobe card of probing frequency as high as 40 GHz that is capable of compensating test samples for coplanar error for use in multi-DUT (Die Under Test) testing.

According to one preferred embodiment of the present invention, the high conducting thin-film nanoprobe card fabrication method comprises the steps of (a) preparing a substrate; (b) arranging electrically conducting nanotubes or nanowires on one side of the substrate and keeping the nanotubes or nanowires standing vertically on the substrate; (c) covering the nanotubes or nanowires with a polymeric resin having a predetermined viscosity and then hardening the polymeric resin to form a high conducting nanomembrane, the high conducting nanomembrane having a first side bonded to the substrate and a second side opposite to the first side; (d) removing a part of the polymeric resin from the second side of the high conducting nanomembrane to expose one end of each of the nanotubes or nanowires to the outside of the high conducting nanomembrane; (e) removing the substrate from the high conducting nanomembrane, and at the same time preparing a ceramic substrate, which has a plurality of contacts located on a first side thereof, and a plurality of metal bumps located on a second side thereof and respectively electrically connected to the contacts; (f) mounting the high conducting nanomembrane on the ceramic substrate to hold the nanotubes or nanowires in contact with the contacts of the ceramic substrate; and (g) removing a part of the second side of the high conducting nanomembrane by etching to form recessed holes in the second side of the high conducting nanomembrane corresponding to the contacts, and then inserting a metal rod in each of the recessed holes respectively.

According to another aspect of the present invention, the method of fabricating a conducting is provided to comprise the steps of: (a) preparing a substrate; (b) arranging electrically conducting nanotubes or nanowires on one side of the substrate and keeping the nanotubes or nanowires standing vertically on the substrate; (c) covering the nanotubes or nanowires with a polymeric resin having a predetermined viscosity and then hardening the polymeric resin to form a high conducting nanomembrane, the high conducting nanomembrane having a first side bonded to the substrate and a second side opposite to the first side; and (d) removing a part of the polymeric resin from the second side of the high conducting nanomembrane to expose one end of each of the nanotubes or nanowires to the outside of the high conducting nanomembrane.

According to still another aspect of the present invention, a high conducting thin-film nanoprobe card is provided to comprise a ceramic substrate having a plurality of contacts located on a first side thereof, and a plurality of metal bumps located on a second side thereof and respectively electrically connected to the contacts; a conducting nanomembrane having a plurality of nanotubes or nanowires arranged in parallel subject to a predetermined pitch, wherein the conducting nanomembrane is mounted on the first side of the ceramic substrate such that the nanotubes or nanowires are respectively connected to the contacts of the ceramic substrate; and a plurality of probes respectively formed of metal rods and respectively bonded to one side of the high conducting nanomembrane opposite to the ceramic substrate corresponding to the contacts.

DETAILED DESCRIPTION OF THE INVENTION

Figure 1A:
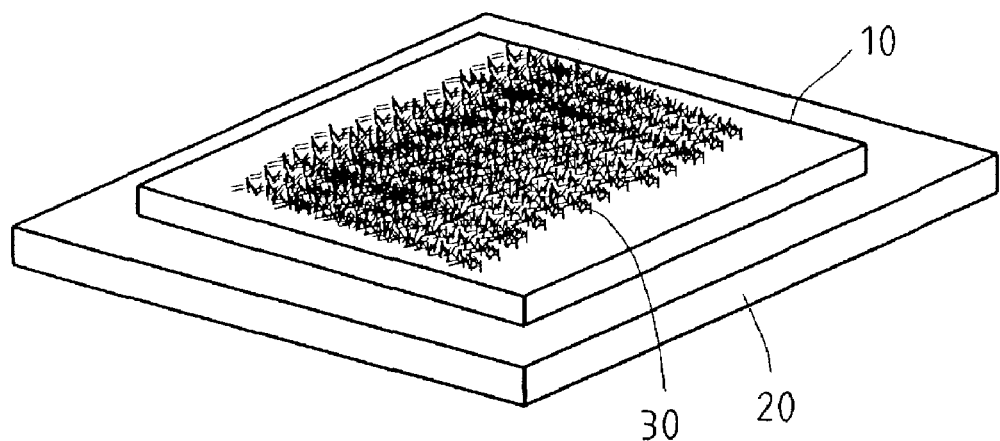
FIG. 1A illustrates nanotubes or nanowires spread on the surface of a substrate above a flat magnetic plate according to a preferred embodiment of the present invention.
Figure 1B:
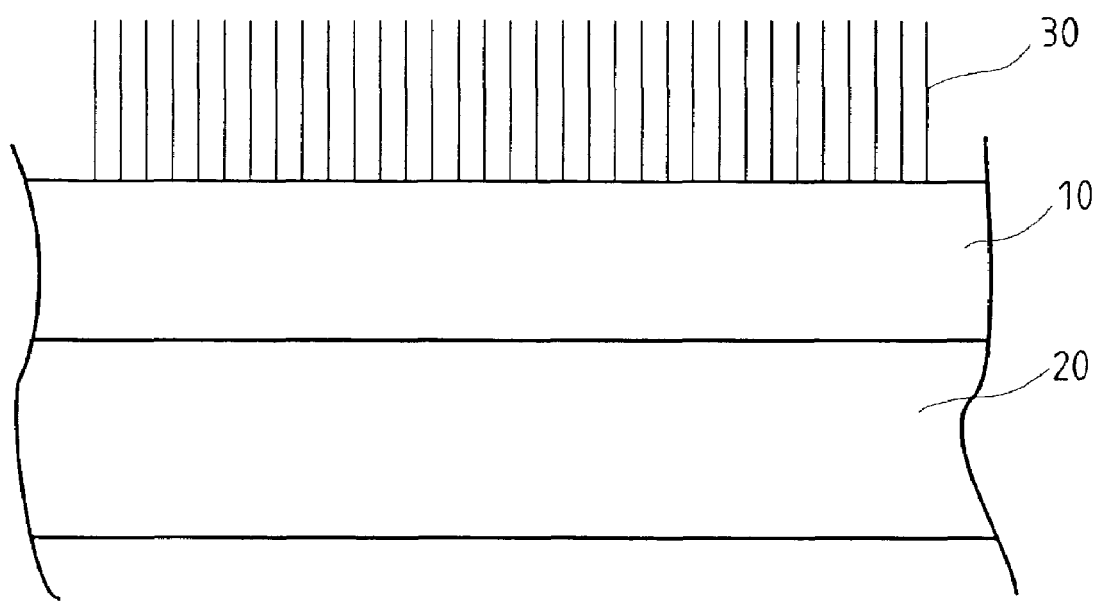
FIG. 1B illustrates the iron/nickel-coated nanotubes or nanowires erected from the top surface of the substrate above the flat magnetic plate according to the preferred embodiment of the present invention.
Figure 2:
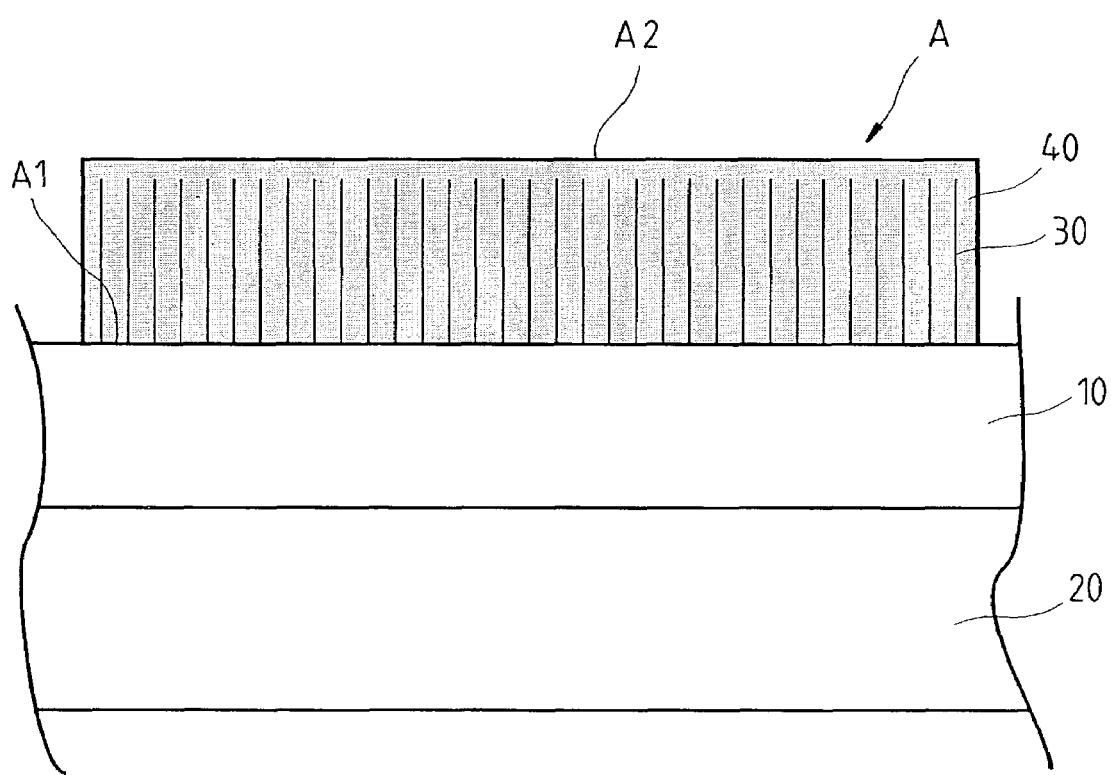
FIG. 2 shows a high conducting nanomembrane formed on the top surface of the substrate above the flat magnetic plate according to the present invention.
Figure 3:
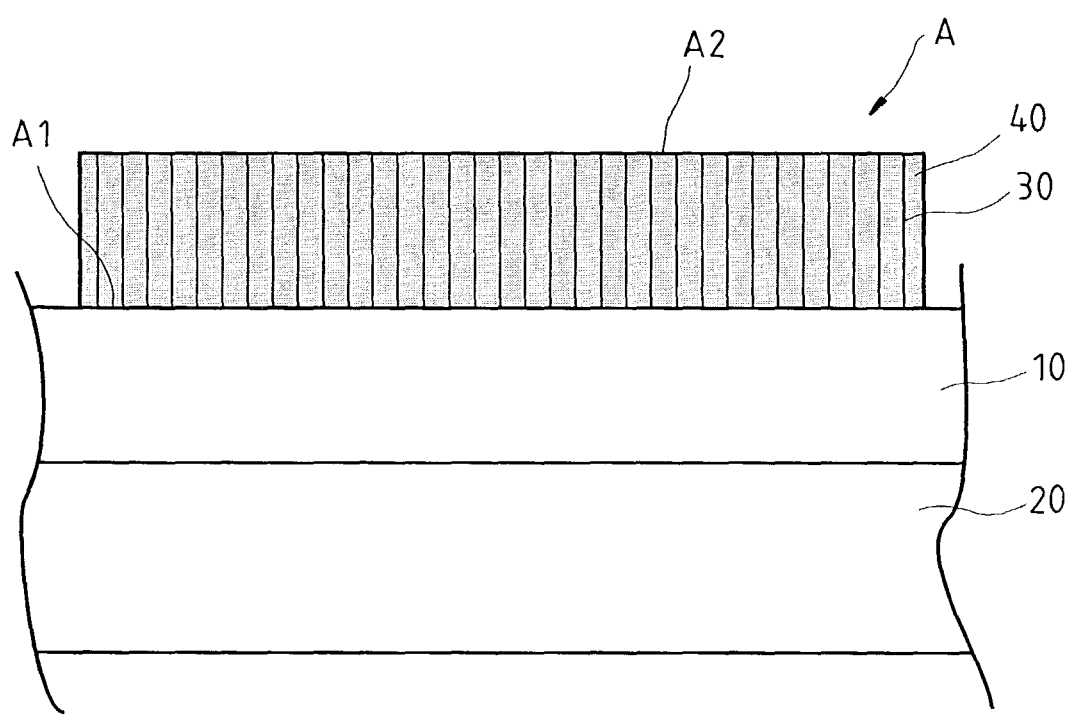
FIG. 3 illustrates a part of the polymeric resin material removed from the second side of the high conducting nanomembrane, the top ends of the iron or nickel-coated nanotubes or nanowires exposed to the outside of the polymeric resin material according to the present invention.
Figure 4A:
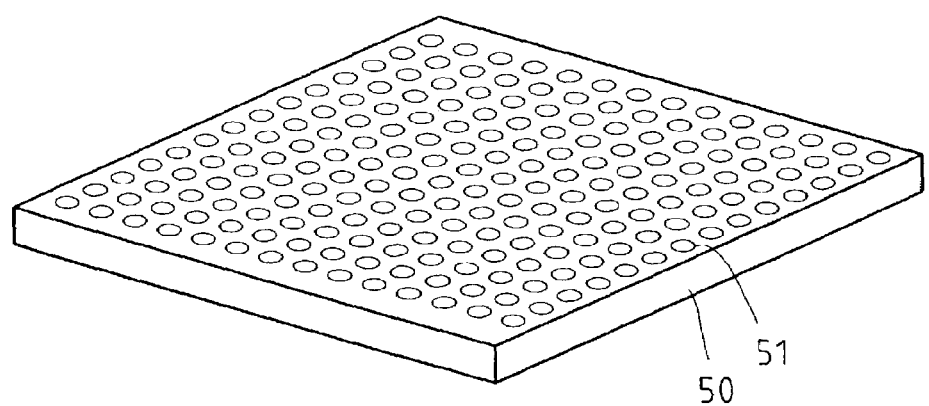
FIG. 4A is an oblique top view of a ceramic substrate according to the preferred embodiment of the present invention.
Figure 4B:
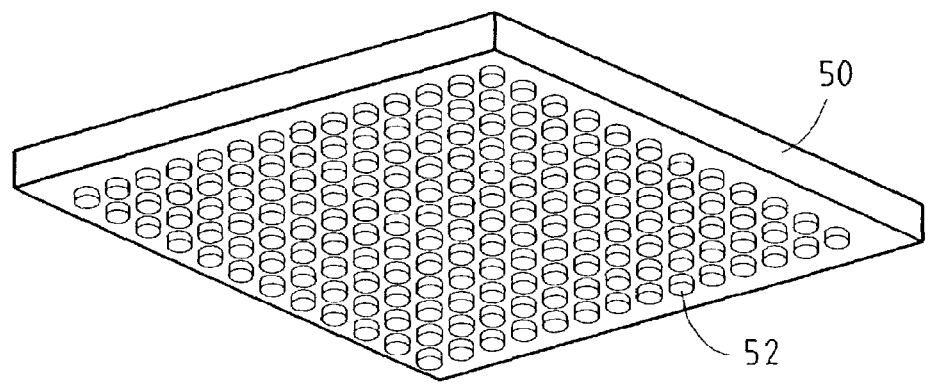
FIG. 4B is an oblique bottom view of the ceramic substrate shown in FIG. 4A.
Figure 4C:
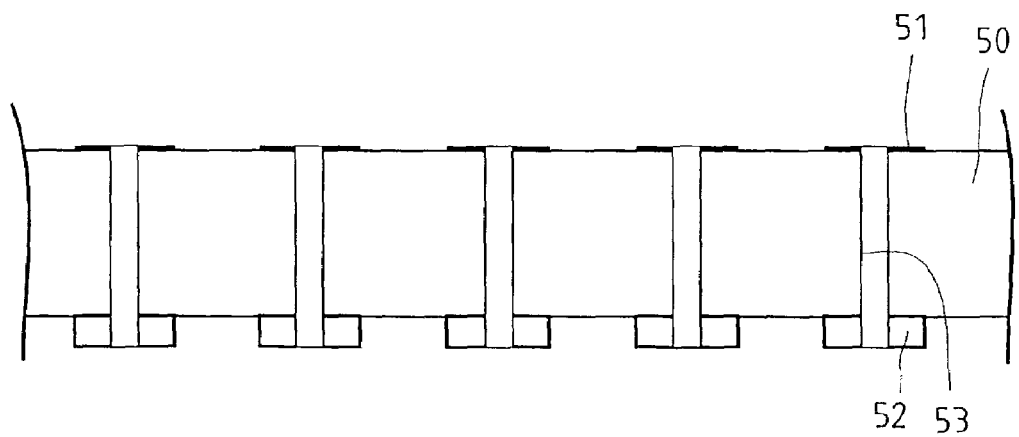
FIG. 4C is a sectional view in an enlarged scale of a part of the ceramic substrate shown in FIGS. 4A and 4B, showing the plated through holes in connection between the contacts and the metal bumps.
Figure 5A:
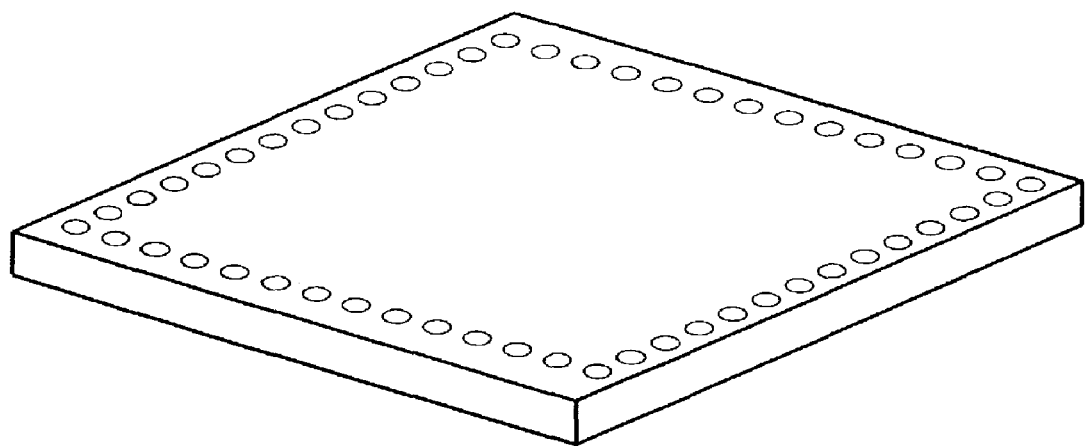
FIG. 5A is an oblique top view of an alternate form of the ceramic substrate according to the present invention.
Figure 5B:
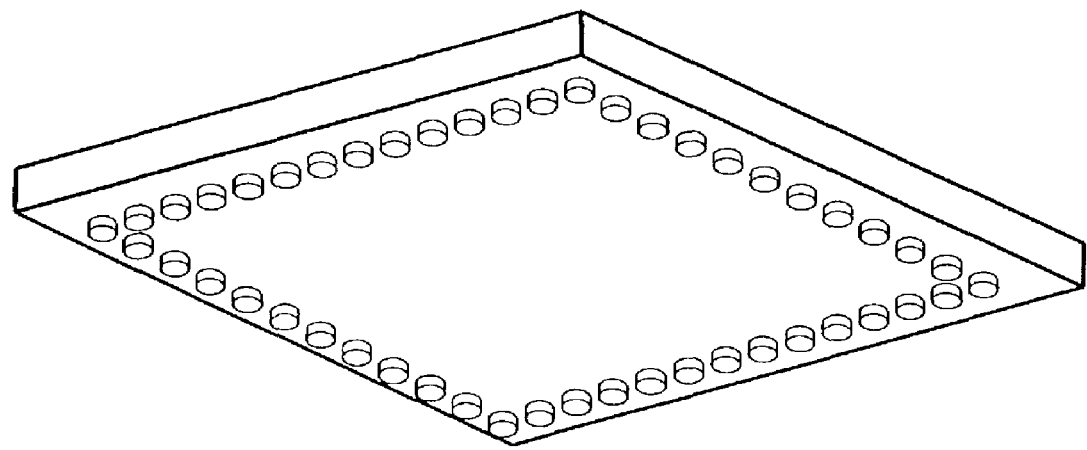
FIG. 5B is an oblique bottom view of the ceramic substrate shown in FIG. 5A.
Figure 6:
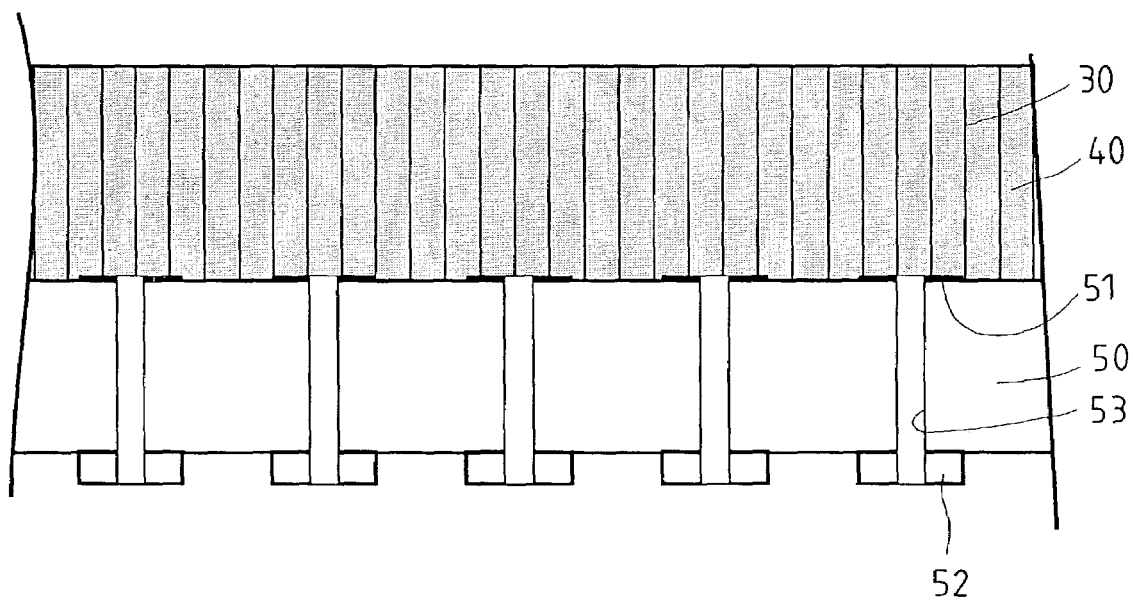
FIG. 6 shows the high conducting nanomembrane mounted on the ceramic substrate, the ends of the iron or nickel-coated nanotubes or nanowires at the first side maintained in contact with the contacts of the ceramic substrate according to the preferred embodiment of the present invention.
Figure 7A:
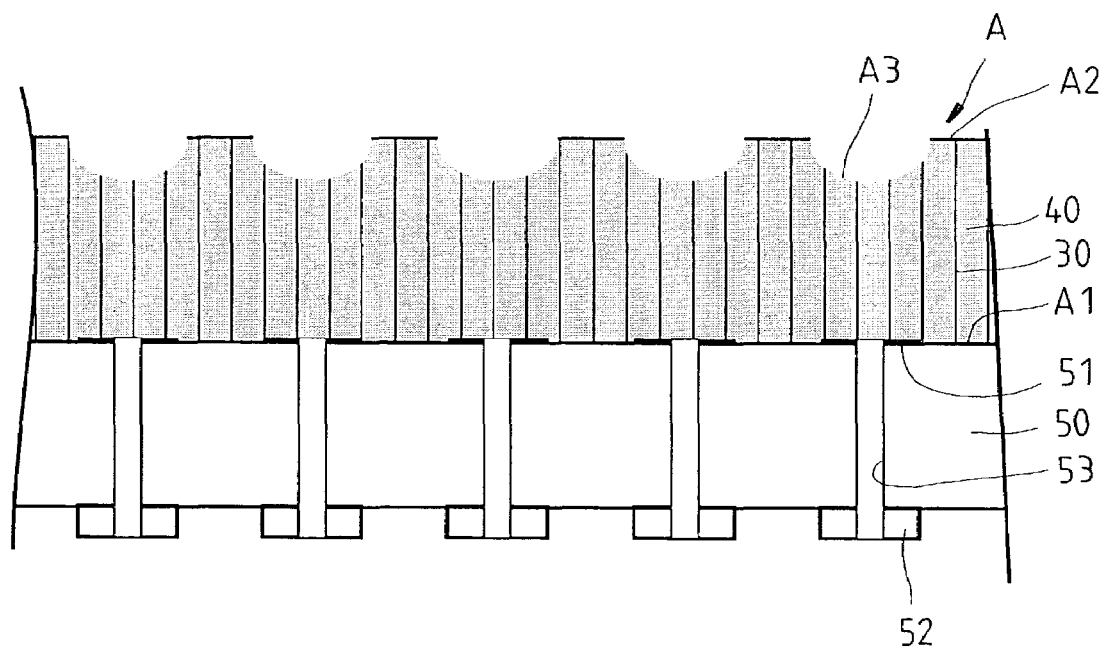
FIG. 7A shows recessed holes formed in the second side of the high conducting nanomembrane corresponding to the contacts according to the preferred embodiment of the present invention.
Figure 7B:
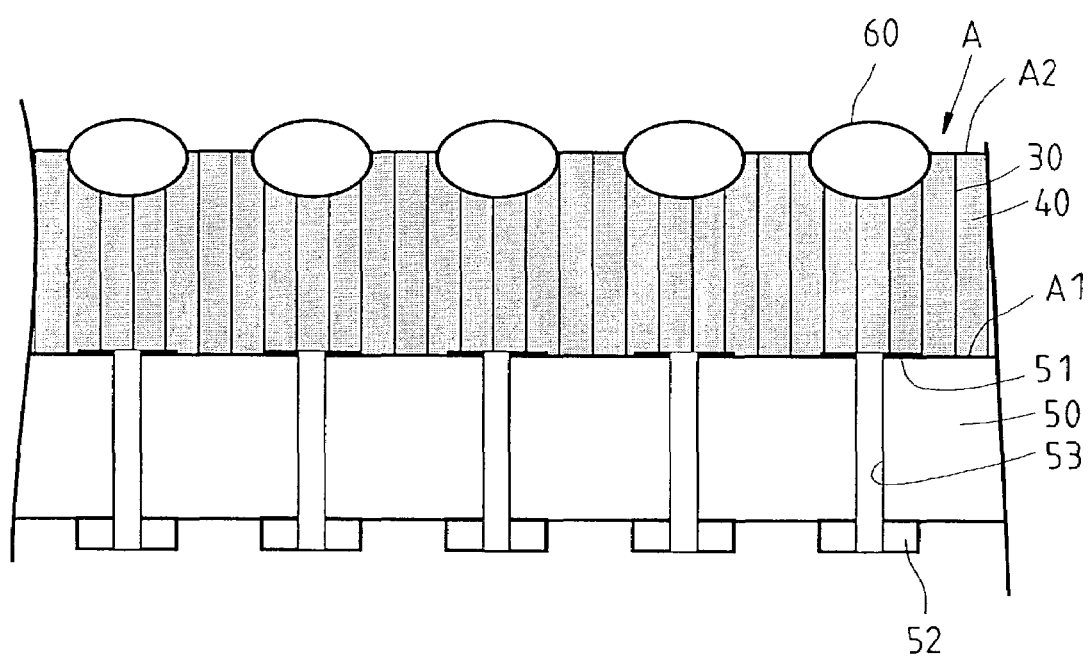
FIG. 7B shows probes installed in the recessed holes in the second side of the high conducting nanomembrane according to the preferred embodiment of the present invention.

A high conducting thin-film nanoprobe card fabrication method in accordance with the first embodiment of the present invention includes the steps as follows:

1. Preparing a substrate 10 of magnetically non-conducting material, then putting the substrate 10 on a flat magnetic plate 20, and then spreading conducting nanotubes or nanowires 30 on the surface of the substrate 10 (see FIG. 1A), and then employing a vacuum evaporating, sputtering, or electroplating technique to coat the nanotubes or nanowires 30 with a layer of magnetically conducting material such as iron or nickel, thereby causing the iron or nickel-coated nanotubes or nanowires 30 to erect from the top side of the substrate 10 due to the effect of the magnetic field of the flat magnetic plate 20 (see FIG. 1B);

2. Applying a liquid polymeric resin material 40 of a predetermined viscosity, for example, liquid epoxy resin, polyamide, PMMA, polystyrene or polycarbonate (PC) to the substrate 10 to let the iron or nickel-coated nanotubes or nanowires 30 be embedded in the liquid polymeric resin material 40, and then using a UV (ultraviolet) lamp to radiate the liquid polymeric resin material 40 or a heater to heat the liquid polymeric resin material 40 to a hardened status, thereby causing the liquid polymeric resin material 40 and the embedded iron or nickel-coated nanotubes or nanowires 30 to form a high conducting nanomembrane A (see FIG. 2), which comprises a polymeric resin material 40 that has a first side A1 linked to the top surface of the substrate 10 and a second side A2 opposite to the first side A1, and iron or nickel-coated nanotubes or nanowires 30 vertically embedded in the polymeric resin material 40 and arranged in parallel subject to a predetermined pitch;

3. Removing a part of the polymeric resin material 40 from the second side A2 of the high conducting nanomembrane A by means of grinding or etching, for enabling the corresponding ends (top ends) of the iron or nickel-coated nanotubes or nanowires 30 to be exposed to the outside of the polymeric resin material 40 (see FIG. 3);

4. Removing the substrate 10 from the high conducting nanomembrane A and, at the same time preparing a ceramic substrate 50, which has a plurality of contacts 51 at one side, a plurality of metal bumps 52 at the other side corresponding to the contacts 51 (see FIGS. 4A and 4B or FIGS. 5A and 5B), and a plurality of plated through holes 53 electrically respectively connected with the contacts 51 and the metal bumps 52 (see FIG. 4C);

5. Mounting the high conducting nanomembrane A on the ceramic substrate 50 to hold the ends of the iron or nickel-coated nanotubes or nanowires 30 at the first side A1 in contact with the contacts 51 of the ceramic substrate 50 by means of using a clamping device (not shown) to clamp the iron or nickel-coated nanotubes or nanowires 30 and then fastening the clamping device to the ceramic substrate 50 to hold the iron or nickel-coated nanotubes or nanowires 30 on the ceramic substrate 50 (see FIG. 6) so as to keep the iron or nickel-coated nanotubes or nanowires 30 electrically connected to the metal bumps 52 of the ceramic substrate 50, and then installing the ceramic substrate 50 in a PC board and bonding the metal bumps 52 to respective contacts of the PC board;

6. Removing a part of the second side A2 of the high conducting nanomembrane A by etching to form recessed holes A3 in the second side A2 of the high conducting nanomembrane A corresponding to the contacts 51 (see FIG. 7A), and then inserting metal rods in the recessed holes A3 to form probes 60 (see FIG. 7B), and therefore the desired high conducting nanomembrane probe card 1 is thus obtained.

Referring to FIG. 7B again, a high conducting nanomembrane probe card 1 made according to the aforesaid fabrication method comprises:

a ceramic substrate 50, which has a plurality of contacts 51 at the first side, a plurality of metal bumps 52 at the second side corresponding to the contacts 51, and a plurality of plated through holes 53 in connection between the contacts 51 and the metal bumps 52;

a high conducting nanomembrane A mounted on the first side of the ceramic substrate 50, the high conducting nanomembrane A having a plurality of iron or nickel-coated nanotubes or nanowires 30 arranged in parallel subject to a predetermined pitch, and a polymeric resin material 40 covering the iron or nickel-coated nanotubes or nanowires 30 and keeping the iron or nickel-coated nanotubes or nanowires 30 respectively connected to the contacts 51 of the ceramic substrate 50; and a plurality of probes 60 respectively formed of metal rods and respectively bounded to one side of the high conducting nanomembrane A opposite to the ceramic substrate 50 corresponding to the contacts 51.

As indicated above, because the iron or nickel-coated nanotubes or nanowires 30 is covered by the springy and high insulated polymeric resin material 40, the probing frequency of the high conducting thin-film nanoprobe card can be as high as 40 GHz, practical for RF device probing. Further, the good springy power of the high conducting nanomembrane A provides the probes (metal rods) 60 with an individual elastic deformation background to compensate test samples for coplanar error. Therefore, the high conducting thin-film nanoprobe card is practical for multi-DUT testing. Further, because the invention eliminates manual installation of probes, the probe card manufacturing cost is greatly reduced.

The high conducting thin-film nanoprobe card fabrication method may be employed in an alternate form, which comprises a series of steps similar to the above-mentioned steps, in which the first step is, however, as follows.

Figure 8A:
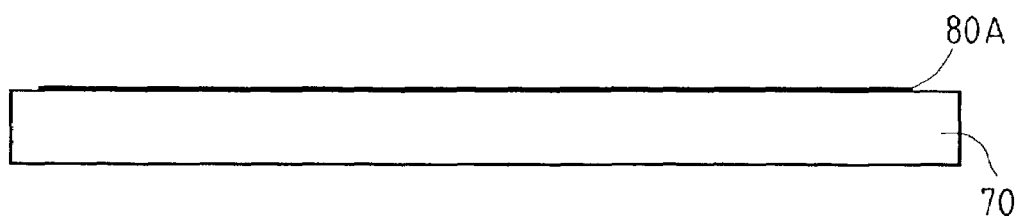
FIG. 8A illustrates a layer of catalyst formed in one side of a silicon substrate according to another preferred embodiment of the present invention.
Figure 8B:
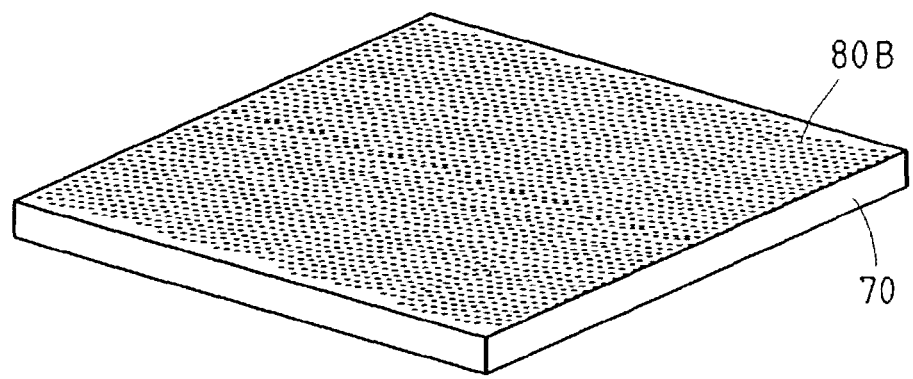
FIG. 8B is an oblique top view showing an array of catalytic points formed in the silicon substrate according to the another preferred embodiment of the present invention.
Figure 8C:
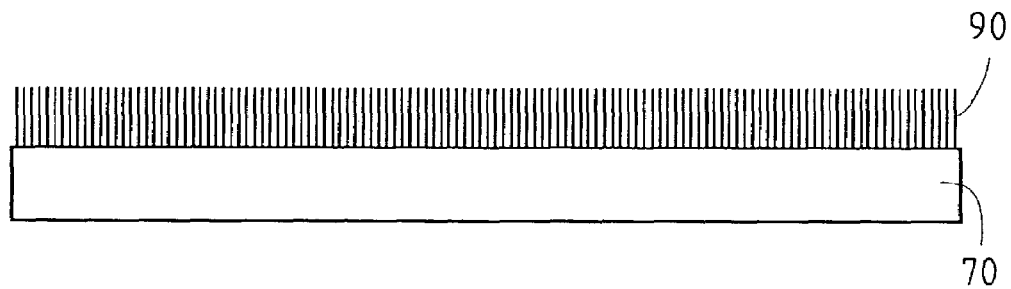
FIG. 8C shows upright nanotubes grown at the catalytic points of the silicon substrate according to the another preferred embodiment of the present invention.

Preparing a silicon substrate 70, and then employing a vacuum evaporating, sputtering, or electroplating technique to form a layer of catalyst 80A, for example, iron or nickel on one side of the silicon substrate 70 (see FIG. 8A), and then etching the layer of catalyst 80A by HF dipping or $NH_3$ pretreatment to form an array of catalytic points 80B subject to a predetermined pattern (see FIG. 8B), and then putting the silicon substrate 70 in a CVD (chemical vapor deposition) tube and guiding a carbon contained gas such as $CH_4$ or $C_2H_2$ into the CVD tube under a predetermined temperature level to grow upright nanotubes 90 at the catalytic points 80B (see FIG. 8C).

The other steps of this alternate form are same as the aforesaid first embodiment of the present invention.

The high conducting thin-film nanoprobe card fabrication method has been constructed with the features of FIGS. 1~8. The high conducting thin-film nanoprobe card fabrication method functions smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A conducting thin-film nanoprobe card comprising:
   a ceramic substrate having a plurality of contacts located on a first side thereof, and a plurality of metal bumps located on a second side thereof and respectively electrically connected to said contacts;
   a conducting nanomembrane comprising a plurality of nanotubes or nanowires arranged in parallel subject to a predetermined pitch, and a highly insulated resin material;
   said conducting nanomembrane being mounted on the first side of said ceramic substrate such that a portion of said nanotubes or nanowires are respectively connected to said contacts of said ceramic substrate and the remaining said nanotubes or nanowires are not respectively connected to said contacts of said ceramic substrate; and
   a plurality of probes respectively formed of metal rods and respectively bonded to one side of said conducting nanomembrane opposite to said ceramic substrate corresponding to said contacts.

2. The conducting thin-film nanoprobe card as claimed in claim 1, wherein said metal bumps are located on the second side of said ceramic substrate at locations corresponding to said contacts.

3. The high conducting thin-film nanoprobe card as claimed in claim 1, wherein said ceramic substrate has a plurality of plated through holes extended through the first and second sides and respectively electrically connected between said contacts and said metal bumps.

4. The conducting thin-film nanoprobe card as claimed in claim 1, which has an elastic deformation background to compensate test samples for coplanar error.

5. The conducting thin-film nanoprobe card as claimed in claim 1, wherein the resin is an epoxy resin, polyamide, PMMA, polystyrene or polycarbonate.

6. The conducting thin-film nanoprobe card as claimed in claim 5, which has an elastic deformation background to compensate test samples for coplanar error.

7. The conducting thin-film nanoprobe card as claimed in claim 6, which has a probing frequency as high as 40 GHz.

* * * * *